United States Patent [19]
Aikou et al.

[11] Patent Number: 5,363,765
[45] Date of Patent: Nov. 15, 1994

[54] ELECTRONIC DELAY CIRCUIT FOR FIRING IGNITION ELEMENT

[75] Inventors: Kenichi Aikou, Tokyo; Eiichi Suzuki; Tugio Goto, both of Nobeoka, all of Japan

[73] Assignee: Asahi Kasei Kogyo Kabushiki Kaisha, Osaka, Japan

[21] Appl. No.: 31,323

[22] Filed: Mar. 15, 1993

[51] Int. Cl.⁵ .................. F42C 11/00; F23Q 21/00
[52] U.S. Cl. .................. 102/220; 102/206; 102/215
[58] Field of Search ............ 102/206, 216, 217, 218, 102/220, 215

[56] References Cited

U.S. PATENT DOCUMENTS

| | | | |
|---|---|---|---|
| 4,445,435 | 5/1984 | Oswald | 102/215 |
| 4,560,954 | 12/1985 | Leach | 331/108 B |
| 5,041,802 | 8/1991 | Wei et al. | 331/116 FE |
| 5,117,756 | 6/1992 | Goffin, II | 102/217 |

FOREIGN PATENT DOCUMENTS

| | | |
|---|---|---|
| 0261886 | 3/1988 | European Pat. Off. |
| 0386860 | 9/1990 | European Pat. Off. |
| 63-53479 | 10/1988 | Japan |
| 1-285800 | 11/1989 | Japan |
| 4-200009 | 7/1992 | Japan |

*Primary Examiner*—Daniel T. Pihulic
*Attorney, Agent, or Firm*—Finnegan, Henderson, Farabow, Garrett & Dunner

[57] ABSTRACT

An electronic delay circuit for firing an ignition element. The delay circuit includes a capacitor which stores electric energy supplied from an electric blasting machine, an oscillator generating a clock pulse train, a circuit for over-exciting the oscillator, a counter which counts clock pulses of the clock pulse train, and a circuit for maintaining a reset state of the counter for a predetermined time period after the electric energy is supplied. The counter produces a trigger signal when it counts a predetermined number of the clock pulses, and the electric energy stored in the capacitor is discharged to the ignition element. Since the oscillator enters into the steady state in a very short time by the over-excitation, the delay circuit has large resistance to external noise.

26 Claims, 9 Drawing Sheets

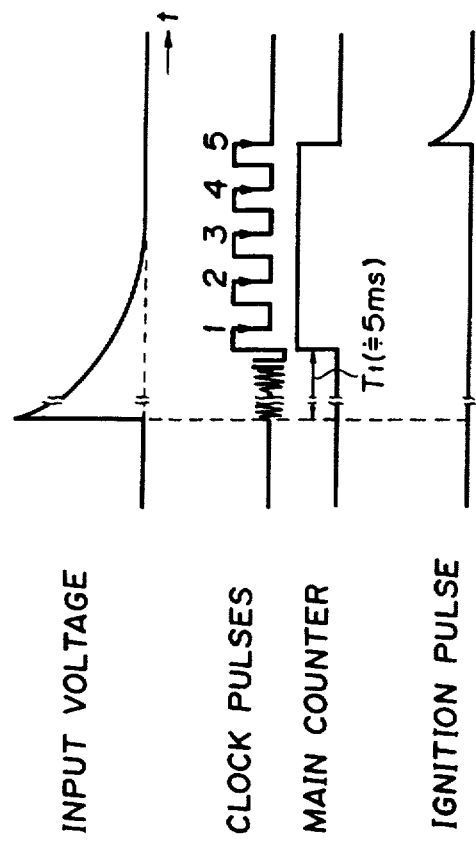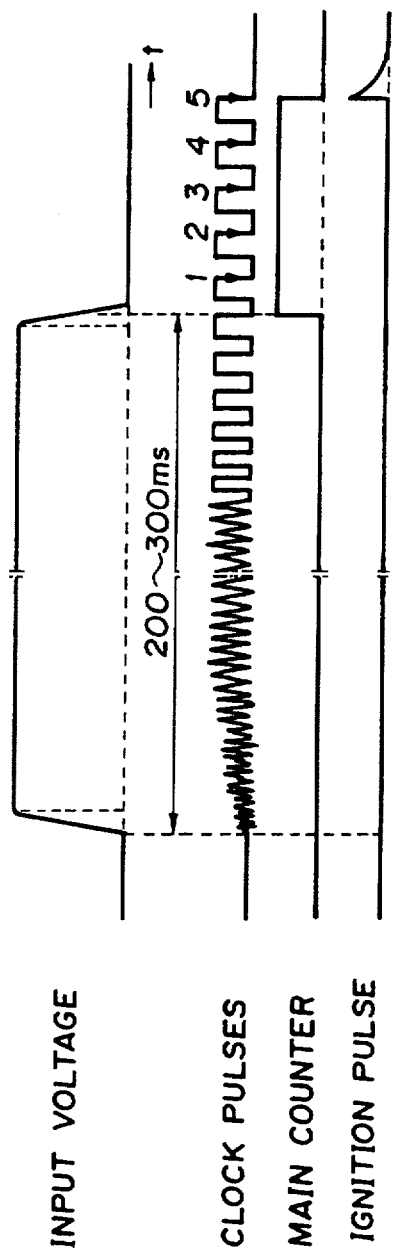

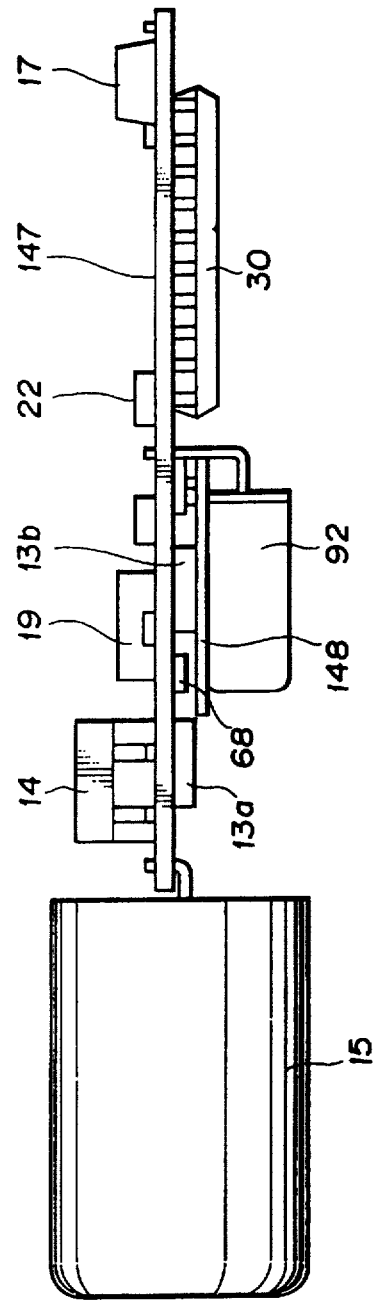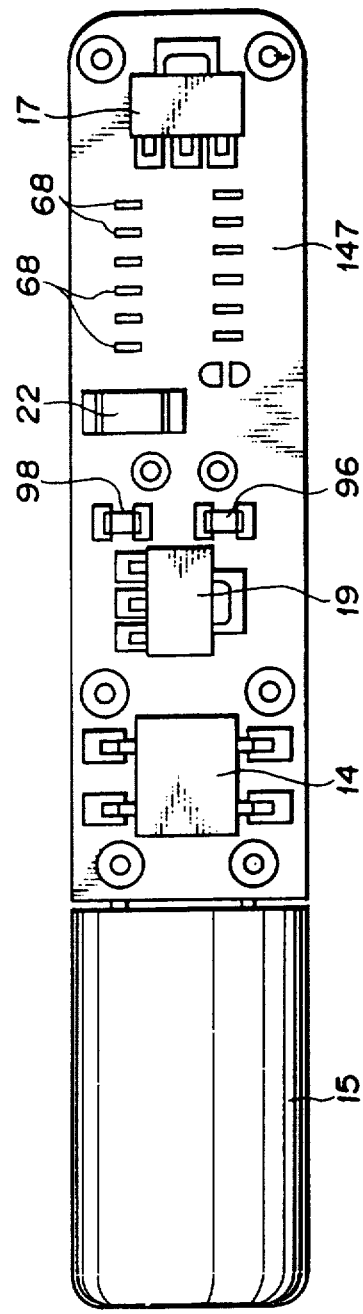
FIG. 8A
FIG. 8B

ELECTRONIC DELAY CIRCUIT FOR FIRING IGNITION ELEMENT

BACKGROUND OF THE INVENTION

1. Field of the Invention

The present invention relates to an electronic delay circuit for firing an ignition element, which stores electric energy supplied from an electric blasting machine, and fires a detonator at high accuracy following a predetermined delay.

2. Related Art

A method for controlling ground vibrations to minimize the effect of blasting on nearby structures in a multi-step blasting system is proposed by Japanese Patent Application Laid-open No. 285800/1989. This application teaches the accuracy of a delay time interval for sequentially firing detonators in order to reduce the ground vibrations. According to the application, it is preferable that the delay time interval t and the standard deviation $\sigma$ of the delay time interval t satisfy the following relationship:

$$t/\sigma \geq 10 \quad (1)$$

The application states that unless the condition is satisfied, the ground vibrations may not be reduced.

Consequently, in order to set the delay time interval for firing detonators at 10 ms, the standard deviation of the delay time must be equal or less than 1 ms. Likewise, the delay time interval of 5 ms requires the standard deviation of 0.5 ms or less.

Japanese Patent Application Publication No. 53479/1988 discloses an electric detonator fired by an electronic delay circuit. This circuit receives only electric energy via leading wires, activates a digital timer comprising a quartz or ceramic oscillator, and fires an electric detonator after a predetermined delay time. The application, however, does not teaches a technique to satisfy the condition of equation (1).

U.S. Pat. No. 4,445,435 teaches an electronic, delay blasting circuit which comprises a means for storing electric energy, an oscillating circuit using a quartz or ceramic oscillator, a digital timer including a counter and a counter reset circuit for resetting the counter, and a means for firing an electric detonator after a predetermined delay time.

Likewise, European Patent Application Publication No. 261,886 discloses a delay circuit for electrically firing a detonating primer (detonator).

FIGS. 1 and 2 illustrate the principle of a delay circuit disclosed by the European patent application. In this figure, an electric blaster (electric blasting machine) 1 supplies a voltage (electric energy) as shown at (a) of FIG. 2. The electric energy is supplied to an actuation circuit 2, a capacitor 3, a clock pulse generator 4 and a counting circuit 5 via leading wires 6, and is stored into the capacitor 3 as shown at (b) of FIG. 2. The actuation circuit 2 maintains the reset state of the counting circuit 5 during counter reset time T (=200–300 ms), and actuates the counting circuit 5 to start counting when the counter reset time T has elapsed after the application of the input voltage is initiated. The time T is defined by the falling edge of the input voltage as shown at (a) and (c) of FIG. 2. This is because the output frequency of a quartz or ceramic oscillator included in the clock pulse generator 4 becomes stable after the counter reset time T as shown at (c) of FIG. 2. The counting circuit 5 counts the pulses of the pulse train produced by the clock pulse generator 4, and trigger a switching circuit 7 as shown at (d) of FIG. 2, so that a current is supplied from the capacitor 3 to an ignition circuit 8. Thus, an electric detonating primer (detonator) is fired after a predetermined delay time as shown at (e) of FIG. 2.

The quartz or ceramic oscillator employed by the clock pulse generator 4 has a problem in that the oscillator takes approximately 200–300 ms before it enters into a steady state oscillation. In other words, the output frequency thereof is unstable during the counter reset time T. Accordingly, the prior art cannot start counting pulses of the pulse train outputted from the oscillator until the counter reset time T has elapsed.

The long counter reset time T presents a problem in that the delay time becomes unstable. There are two major reasons for this.

First, as the counter reset time increases, the probability that the input voltage as shown at (a) of FIG. 2 may be influenced by external noise during the counter reset time T increases. The external noise may change the falling edge of the input voltage, and hence will change the starting time of the counting circuit 5. This is a great problem because there is much noise caused by incomplete contact of the lines (leading wires) or by switching the electric blasting machine or the like in a blasting site. To improve such a problem, the actuation circuit 2 becomes complicated, and hence increase in size and cost thereof will be unavoidable.

Second, as the counter reset time increases, the error of the counter reset time will increase since the counter reset time is specified by the analog voltage. In addition, the increasing electric power will be consumed as the counter reset time becomes longer.

In addition, it is difficult to apply the prior art to a serially connected blasting system.

SUMMARY OF THE INVENTION

It is therefore an object of the present invention to provide an electronic delay circuit for firing an ignition element that can improve the accuracy of delay time for firing a detonator.

It is another object of the present invention to provide an electronic delay circuit for firing an ignition element that can reduce the electric power consumed during the operation of a timer circuit.

In a first aspect of the present invention, there is provided an electronic delay circuit for firing an ignition element comprising:

- means for storing electric energy supplied from an electric blasting machine;
- means for oscillating a clock pulse train by using the electric energy stored in the means for storing;
- means for over-exciting the means for oscillating;
- means for counting clock pulses of the clock pulse train;
- means for producing a trigger signal when the means for counting counts a predetermined number of the clock pulses of the clock pulse train; and
- means for discharging electric energy stored in the means for storing to the ignition element in response to the trigger signal.

The means for over-exciting may comprise means for supplying current from the means for storing to the means for oscillating for a first predetermined time after the electric energy is supplied.

An electronic delay circuit for firing an ignition element may further comprise means for maintaining a reset state of the means for counting for a second predetermined time period after the electric energy is supplied, wherein the means for maintaining a reset state may release the reset state when the second predetermined time period is over so that the means for counting starts counting.

The means for maintaining the reset state may comprise a time constant circuit and a comparator, the time constant circuit comprising a capacitor and a resistor, and the comparator comparing a voltage across the capacitor with a predetermined reference voltage.

The second predetermined time period of the means for maintaining the reset state may be equal to or less than 5 ms.

An electronic delay circuit for firing an ignition element may further comprise discharging means, connected in parallel with the means for storing, for promoting discharge of the electric energy stored in the means for storing.

The means for counting may be a preset counter whose initial value is set by cutting preset wire.

An electronic delay circuit for firing an ignition element may further comprise means for presetting the initial value of the preset counter, wherein the means for presetting may comprise means for disconnecting the means for presetting from the means for storing after the preset of the initial value has been completed.

An electronic delay circuit for firing an ignition element may further comprise a resistor connected between lines carrying the electric energy inputted to the means for storing.

The means for oscillating, means for counting, and means for over-exciting may be integrated into one IC chip.

In a second aspect of the present invention, there is provided an electronic delay circuit for firing an ignition element comprising:

means for storing electric energy supplied from an electric blasting machine;

means for oscillating a clock pulse train by using the electric energy stored in the means for storing;

means for maintaining a reset state of the means for counting for a second predetermined time period after the electric energy is supplied, by using the electric energy stored in the means for storing, the means for maintaining a reset state releasing the reset state when the second predetermined time period is over so that the means for counting starts counting;

means for producing a trigger signal when the means for counting counts a predetermined number of the clock pulses of the clock pulse train; and means for discharging electric energy stored in the means for storing to the ignition element in response to the trigger signal.

According to the preferred embodiments of the present invention, the output frequency of the means for oscillating reaches a steady state frequency in a very short time because of the over-excitation. As a result, the accuracy of the delay time for firing the detonator is improved. In addition, since the means for counting starts counting after the output frequency has entered into the steady state, a high precision, reliable delay time can be obtained.

Furthermore, the short rising time of the oscillation reduces the power consumption of the oscillator. As a result, the size of the capacitor storing the electric energy can be reduced. This makes it possible to provide easy-to-use detonators.

In the preferred embodiments of the present invention, the counter reset time is created inside the delay circuit. Therefore, detection of the external signal for controlling the counter reset time is unnecessary unlike the prior art stated before. Thus, a highly reliable electronic detonator can be achieved.

The counter reset time is set at approximately equal to the time during which the output frequency of the means for oscillating reaches the steady state. Since the counter reset time is very short in the present invention, a simple circuit comprising the capacitor and the resistor can achieve a sufficiently accurate counter reset time. This reduces the cost of the circuit.

The above and other objects, effects, features and advantages of the present invention will become more apparent from the following description of the embodiment thereof taken in conjunction with the accompanying drawings.

BRIEF DESCRIPTION OF THE DRAWINGS

FIGS. 6A and 6B are diagrams comparatively illustrating waveforms of the embodiment shown in FIG. 3 and the prior art shown in FIG. 1;

FIGS. 8A and 8B are diagrams showing an arrangement of components packed in the detonator.

DETAILED DESCRIPTION OF PREFERRED EMBODIMENTS

The invention will now be described with reference to the accompanying drawings.

Figure 3:
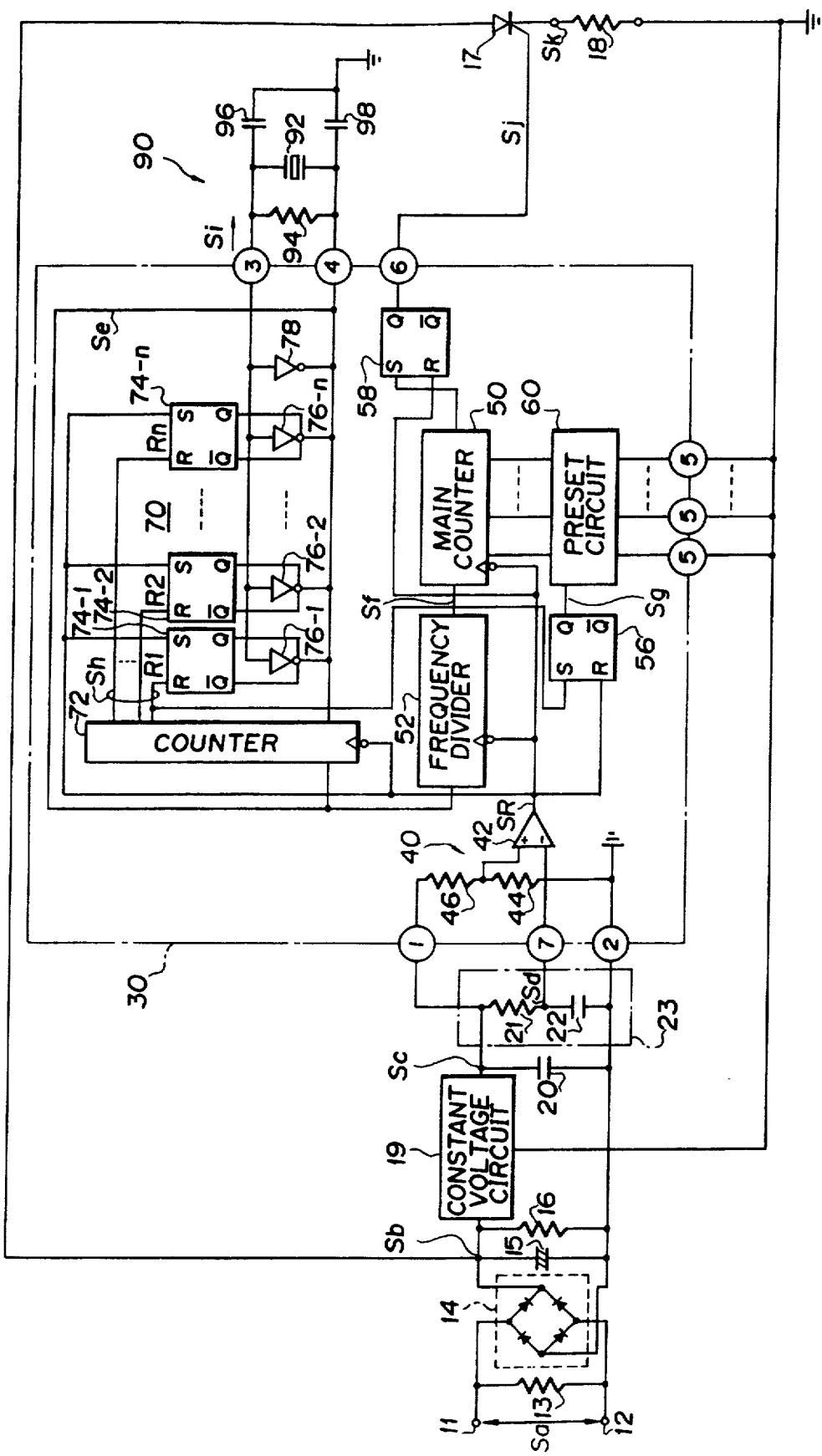
FIG. 3 is a block diagram showing an embodiment of an electronic delay circuit for firing an ignition element in accordance with the present invention.

FIG. 3 is a block diagram showing an embodiment in accordance with the present invention.

Figure 1:
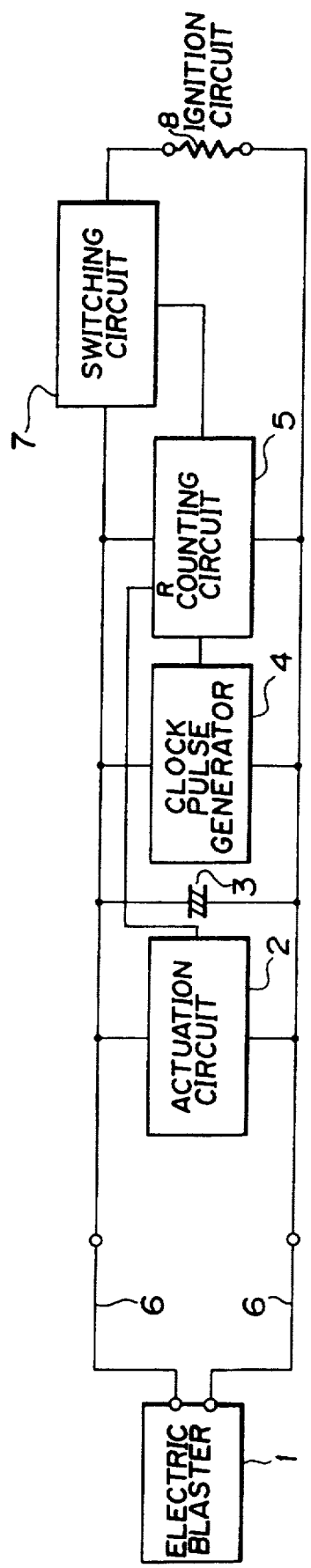
FIG. 1 is a schematic block diagram illustrating a principle of a prior art electronic delay circuit for use in a detonator.
Figure 2:
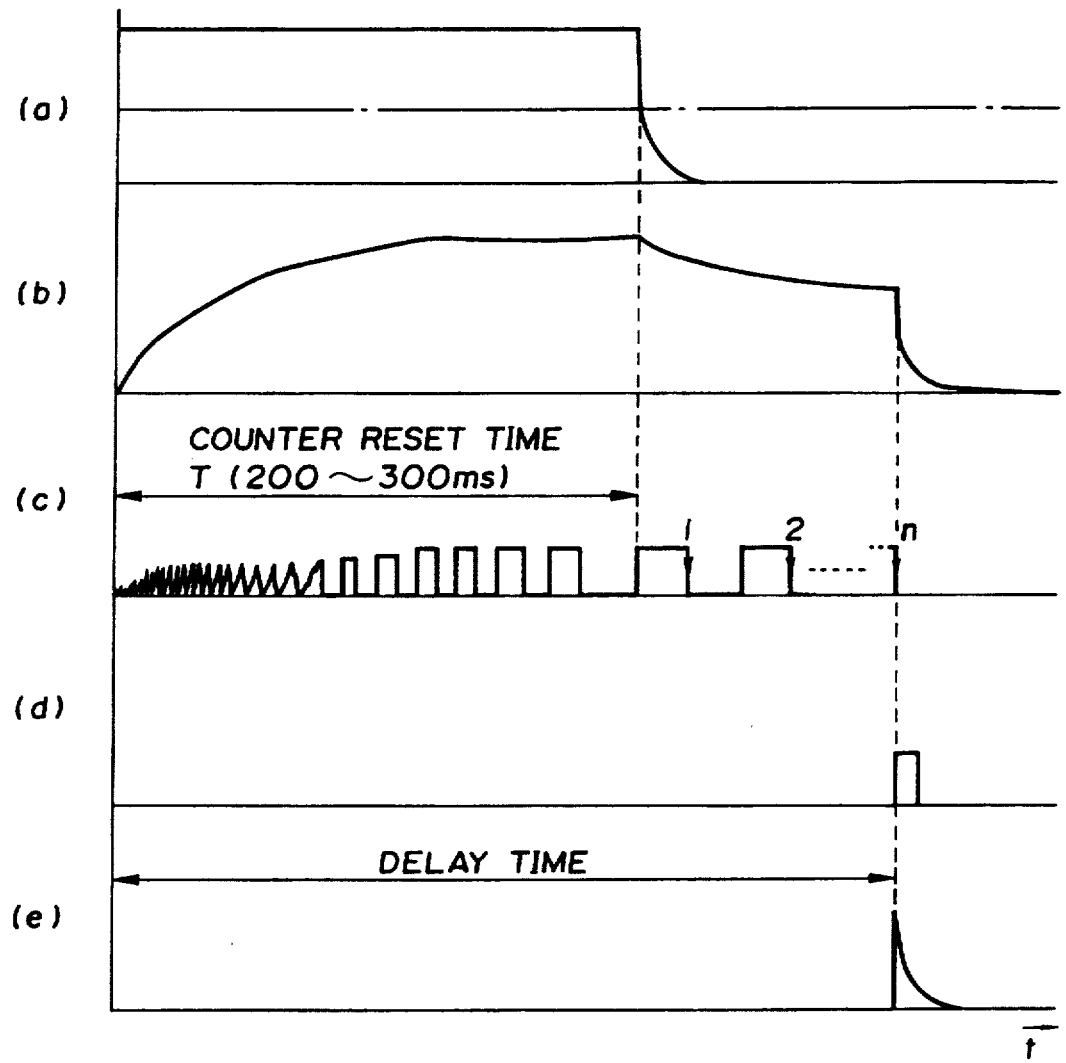
FIG. 2 is a diagram illustrating waveforms of various portions of FIG. 1.

In this figure, input terminals 11 and 12 are connected to the electric blasting machine 1 of FIG. 1 via leading wires 6. A resistor 13 and a rectifier 14 are connected between the input terminals 11 and 12. A capacitor 15 and a resistor 16 are connected in parallel between the output terminals of the rectifier 14. The resistor 13 prevents stray current, which may often take place in a blasting site, from charging the capacitor 15 to such a voltage as firing the detonator. Furthermore, the resistor 13 serves as a voltage divider when a plurality of detonators are connected in series in a multi-step blasting system so that an approximately equal voltage is supplied to each rectifier 14. The rectifier 14 makes it possible for the capacitor 15 to be charged in one direction regardless of the polarity of the input voltage supplied to the terminals 11 and 12. In this embodiment, the resistance of the resistor 13 is 15 $\Omega$, and the capacitor of the capacitance 15 is 1,000 microfarad. In this case, the capacitor 15 is charged to the maximum voltage of 15 V in 5-10 ms by the electric energy supplied from the electric blasting machine 1.

A serial circuit of a thyristor (a switching device) 17 and an igniting resistor 18 is connected across the capacitor 15. In addition, the input terminals of a constant voltage circuit 19 are connected across the capacitor 15. A capacitor 20 and a serial circuit of a resistor 21 and a capacitor 22 are connected in parallel across the output terminals of the constant voltage circuit 19. The resistor 21 and the capacitor 22 constitute a counter reset time circuit 23. Further, a digital timer 30 is connected to the output terminals of the constant voltage circuit 19.

The digital timer 30 comprises a reset circuit 40, a main counter 50 that counts the delay time for firing the detonator, a preset circuit 60 that presets an initial value of the main counter 50, a over-exciting circuit 70 for over-exciting an oscillator 90 so that the oscillator 90 enters into steady state in a very short time.

The reset circuit 40 comprises a comparator 42, and a voltage divider consisting of resistors 44 and 46. The inverting input terminal of the comparator 42 is connected to the connecting point of the resistor 21 and the capacitor 22, and the noninverting input terminal of the comparator 42 is connected to the connecting point of the resistors 44 and 46. Accordingly, the output of the comparator 42 changes from a high level to a low level after a predetermined time T1 defined by the time constant of the resistor 21 and the capacitor 22. The predetermined time T1 is specified as 5 ms, for example, which corresponds to the counter reset time of the preferred embodiments of the present invention.

The main counter 50 is a 13-bit preset type counter to which a pulse train Sf is supplied from a frequency divider 52. The frequency divider 52 is a 12-bit divider. Thus, the output frequency of the divider 52 is 1/4096 of the frequency of the clock pulse train Se supplied from the oscillator 90.

The main counter 50 is connected to the preset circuit 60 which presets the initial value of the main counter 50. The preset circuit 60 is activated by a flip-flop 56. The flip-flop 56 is reset by the rising edge of the signal SR. The main counter 50 and the frequency divider 52, on the other hand, are reset by the falling edge of the signal SR.

Figure 4A:
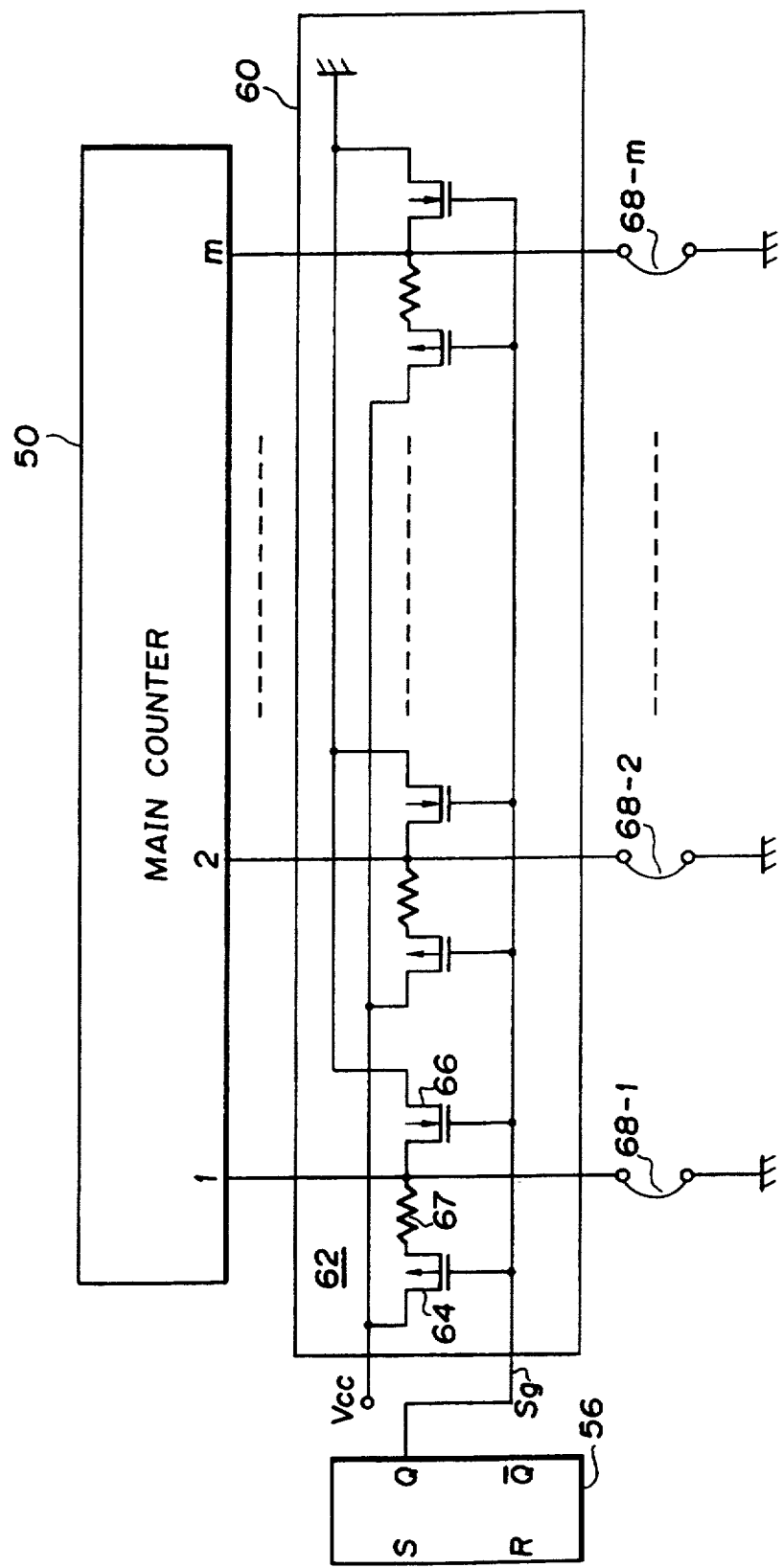
FIG. 4A is a circuit diagram showing a preset circuit of FIG. 3.

FIG. 4A shows the preset circuit 60 comprising a plurality of switching circuits 62. Each switching circuit 62 comprises a p-channel FET 64 and an n-channel FET 66 connected in series via a resistor 67. The gates of the two FETs are connected to the Q output of the flip-flop 56. When the flip-flop 56 is in the set state, that is, when the gate voltage is higher than a threshold voltage, the p-channel FET 64 is cut off and the n-channel FET 66 is conducted. Therefore, the output level of each switching circuit 62 is low, and preset value of the main counter 50 is unchanged. In contrast, when the flip-flop 56 is in the reset state, that is, when the gate voltage is lower the threshold voltage, the p-channel FET 64 is conducted and the n-channel FET 66 is cut off. In this case, the output level of each switching circuit 62 is determined by the state of time set lines 68-1, 68-2, ..., 68-m. The output level of the switching circuit 62 will be low when the time set line 68-j is grounded, whereas it will be high when the time set line 68-j is open.

Referring again to FIG. 3, the output of the main counter 50 is supplied to a flip-flop 58, and sets the flip-flop 58 which has been previously reset by the rising edge of the signal SR. When the flip-flop 58 is set, the thyristor 17 is triggered and is turned on. Thus, all the electric energy which remains in the capacitor 15 after the delay circuit has consumed is supplied to the ignition resister 18, and the detonator explodes.

The over-exciting circuit 70 comprises an auxiliary counter 72, flip-flops 74-1, 74-2, ..., 74-n, clocked inverters 76-1, 76-2, ..., 76-n and an inverter 78. The counter 72 outputs signals R1, R2, ..., Rn every 1 $\mu$s interval, and supplies them to the reset terminal of the flip-flops 74-1, 74-2, ..., 74-n, respectively. The flip-flops 74-1, 74-2, ..., 74-n are simultaneously set by the rising edge of the signal SR, and are reset sequentially by the signals R1, R2, ..., Rn. The output terminal of the flip-flop 74-i (i=1, 2, ..., n) is connected to the control terminal of the clocked inverter 76-i. The over-exciting circuit itself is known in the field of electronic circuit as disclosed in FIG. 9 of Japanese Patent Application Laying-open No. 200009/1992.

Figure 4B:
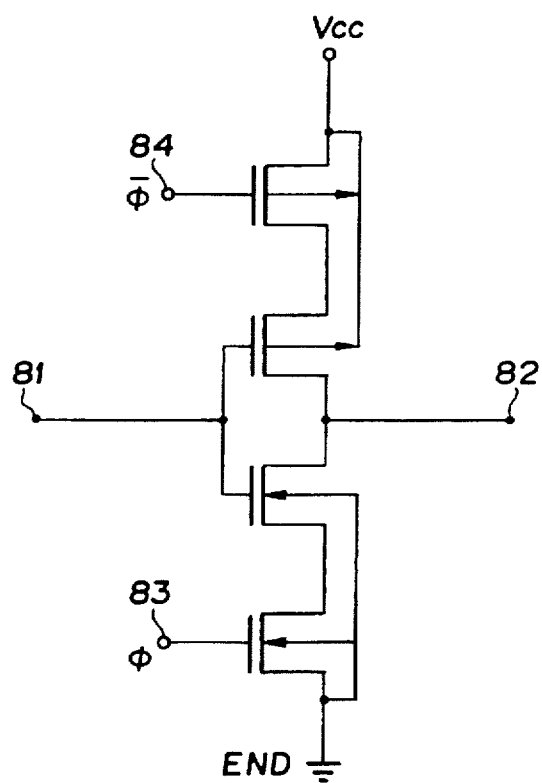
FIG. 4B is a circuit diagram showing a clocked inverter of FIG. 3.

FIG. 4B is a circuit diagram of the clocked inverter 76-i. The control terminals 83 and 84 of the clocked inverter 76-i are connected to the output terminals of the flip-flop 74-i. The input terminal 81 and the output terminal 82 of the clocked inverter 76-i is connected to the oscillator 90. When a high level signal is applied to the control terminal 83 and a low level signal is applied to the control terminal 84, the clocked inverter functions as an inverter. On the other hand, when the low level signal is applied to the control terminal 83 and a high level signal is applied to the control terminal 84, the clocked inverter is electrically separated from the oscillator 90.

The oscillator 90 comprises a quartz oscillator 92, a feedback resistor 94 connected in parallel with the quartz oscillator 92, capacitors 96 and 98 connected between the quartz oscillator 92 and the ground. The frequency of the quartz oscillator is preferably in the range from 1 MHz to 16 MHz. If the frequency is too low, the rising time of the oscillation becomes long. As a result, the counter reset time T1 increases, and the accuracy of the delay time is adversely affected. If the frequency is too high, the power consumption increases. As a result, the capacitor 15 cannot supply enough electric energy to explode the detonator.

Next, the operation of the delay circuit of FIG. 3 will be described with reference to FIG. 5.

Figure 5:
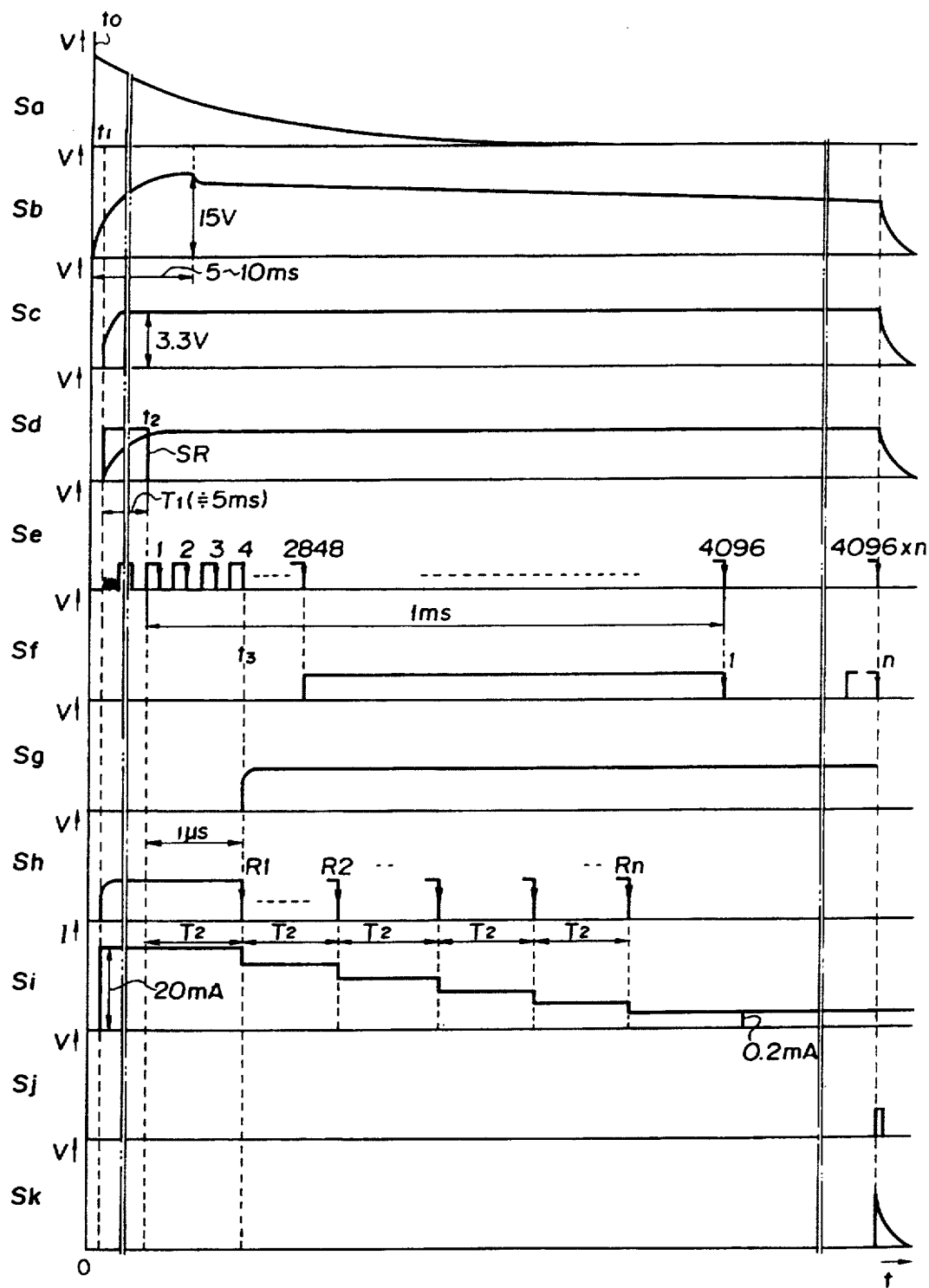
FIG. 5 is a diagram illustrating waveforms of various portions of FIG. 3.

FIG. 5 illustrates waveforms of various portions of the delay circuit.

A voltage Sa is applied to the input terminals 11 and 12 from the electric blasting machine 1 at time t0. The electric energy provided by the voltage Sa is stored into the capacitor 15, and the voltage Sb across the capacitor 15 increases rapidly. The constant voltage circuit 19 starts operating at time t1 immediately (a few microseconds) after the application of the voltage Sa, and outputs a constant voltage Sc (=3.3 V, for example).

The output voltage Sc is applied to the capacitor 22 through the resistor 21, and hence the voltage Sd across the capacitor 22 gradually increases. When the voltage Sd exceeds the voltage determined by the voltage divider consisting of the resistors 44 and 46 at time t2, the output of the comparator 42 changes its output level from high to low, and this change makes the falling edge of the signal SR. Thus, the falling edge of the signal SR is produced when time interval T1 (approximately 5 ms in this embodiment) has elapsed after time t1. The signal SR sets the flip-flops 74-l-74-n, and resets the flip-flops 56 and 58 by its rising edge at time t1. On the other hand, the signal SR resets the main counter 50, the frequency divider 52, and the counter 72 by its falling edge at time t2.

During time interval T1, the quartz oscillator 92 is over-excited by the clocked inverters 76-1–76-n and the inverter 78, and enters into the steady state. That is, the frequency of the pulse train outputted from the quartz oscillator 92 becomes stable during the time interval T1.

At time t2, the frequency divider 52 starts its operation and outputs a pulse train Sf consisting of pulses whose interval is 1 ms. At the same time, the counter 72 starts counting of the clock pulse supplied from the oscillator 90, and generates signals R1-Rn every 1 $\mu$s interval. The signal R1 sets the flip-flop 56 and reset the flip-flop 74-1 at time t3 which is 1 $\mu$s after time t2. Accordingly, the signal Sg applied to the preset circuit 60 rises at time t3, and separates the preset circuit 60 from the constant voltage circuit 19. This reduces the power consumed by the delay circuit.

After time t3, the flip-flops 74-1–74-n are sequentially reset every T2 interval (1 $\mu$s) by the signal Sh (=R1, R2, ..., Rn). Accordingly, the clocked inverters 76-1–76-n are sequentially cut off from the oscillator 90. Thus, the over-excitation of the oscillator 90 is gradually released by the signal Sh. As a result, the current Si supplied to the oscillator 90 gradually changes from 20 mA, which is initially supplied from the clocked inverters 76 and the inverter 78 during the over-excitation, to 0.2 mA, which is supplied by the inverter 78 during the steady state excitation.

The quartz oscillator 92 consumes substantially large power at the initial stage of oscillation, and automatically reduces its consumption power as the oscillation approaches the steady state. Accordingly, the over-excitation of the quartz oscillator 92 by the clocked inverters, which are activated by a constant voltage, does not cause thermal damage of the oscillator, and leads the oscillation to the steady state in a very short time.

By using this feature of the quartz oscillator, the clocked inverters 76 and the inverter 78 may be replaced with an inverter that can supply sufficient current to induce the over-excitation of the quartz oscillator. In this case, the clocked inverters 76 and the flip-flops 74 can be omitted.

When the count value of the main counter 50 reaches the preset value, the main counter 50 sets the flip-flop 58. This produces a trigger signal Sj of the thyristor 17, and the current Sk is supplied from the capacitor 15 to the ignition resistor 18. Thus, the detonator explodes.

FIGS. 6A and 6B are diagrams comparatively illustrating the characteristics of the present invention and the prior art described before.

The counter reset time T1 of the present invention is much shorter than that of the prior art. For example, the counter reset time T1 of the present invention is about 5 ms, whereas that of the prior art is about 200614 300 ms. Furthermore, although the counter 50 of the present invention is started by the signal SR generated inside the circuit, the counter of the prior art is started by the input voltage supplied from the electric blasting machine 1 via the leading wires 6. As a result, the start of the counter of the prior art is susceptible to external noise. In contrast, the start of the counter of the present invention is insusceptible to external noise.

The electronic delay detonator can be miniaturized by using an IC (integrated circuit) technique.

Figure 7:
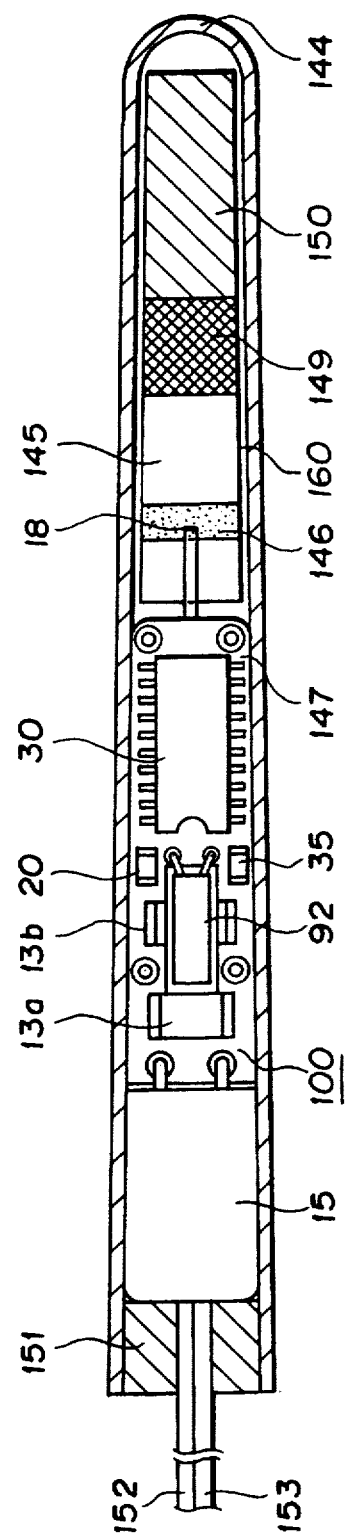
FIG. 7 is a longitudinal sectional view of a detonator in accordance with the present invention.

FIGS. 7, 8A and 8B illustrate the arrangement inside a detonator in accordance with the embodiment.

A cylindrical housing 144 comprises the delay circuit 100 and a shell 160. The shell 160 comprises the ignition resistor 18, ignition charge 146, space 145, primer charge 149, base charge 150. The delay circuit 100 is arranged on a printed board 147, and the output of the delay circuit 100 is applied to the ignition resistor 18 through lead wires. The printed board 147 has thereon the digital timer 30 which is integrated into an IC chip, resistors 13a and 13b constituting the resistor 13, the rectifier 14, the thyristor 17, the constant voltage circuit 19, the capacitor 22, and the oscillator 92. The capacitor 15 for storing the electric energy is attached to the printed board 147. The quartz oscillator 92 is stuck to the printed board 147 with a double adhesive tape 148. Further, the time set lines 68 are formed on the bottom side of the printed board 147. The housing is closed with a cap 151, and leg lines 152 and 153 are led from inside to outside of the housing through the cap 151.

According to this arrangement, these components can be packed into the housing 144 whose outer diameter is equal to or less than 17 mm and whose length is equal to or less than 110 mm. In this case, the circuit including the capacitor 15 has an outer diameter equal to or less than 11 mm and a length equal to or less than 53 mm.

In this embodiment, the capacitor 22 of 0.0062 $\mu$F$\pm$5%, and the resistor 21 of 750 k$\Omega\pm$2% are employed. In addition, the threshold voltages of the reset terminals in the digital timer 30 are 2.07 V$\pm$5%. The total error caused by these errors is estimated by the mean square. The estimated total error of the counter reset time T1 is 7.9% or $\pm$0.4 ms. The timer reset times T1 are measured with regard to 500 samples fabricated as test detonators, and they are within 4.7$\pm$0.2 ms.

The accuracy of the quartz oscillator 92 is 30 ppm. Accordingly, when the delay time is set at 8 seconds, the error due to the quartz oscillator 92 is approximately 0.2 ms. In the case where the total error of the counter reset time T1 is 0.4 ms, the total error becomes 0.6 ms (=0.2+0.4). Hence, the accuracy better than $\pm$1 ms can be achieved.

According to the embodiment, since the counter reset time T1 is much shorter than that of the prior art, high accuracy is not required of the resistor 21 and the capacitor 22. Therefore, an inexpensive counter reset time circuit 23 can be constructed using a cheap resistor and capacitor.

In addition, low power consumption is achieved. This is because the delay circuit is composed of C-MOS ICs, and the preset circuit 60 is disconnected after the preset operation.

The digital timer 30 before packaging, to which no lead frame is attached, may be employed instead of the packaged IC digital timer. In this case, the size of the delay circuit will be further reduced. The oscillator 92 may be replaced by a chip-type oscillator which is thinner than the oscillator 92 shown in FIG. 8A.

Furthermore, all the components except for capacitors 15, 20, 22, 96 and 98 can be integrated into one IC chip. This will further miniaturize the delay circuit. Moreover, the IC chip may be contained in the shell 160.

In addition, the delay circuit 100 may be packed in a case, and may be connected to the shell 160 through a connector.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An electronic delay circuit for firing an ignition element comprising:
    means for storing electric energy from an electric blasting machine;
    means for oscillating a clock pulse train by using the electric energy stored in said means for storing;
    means for over-exciting said means for oscillating;
    means for detecting an elapsed time relative to a time when the electric blasting machine begins to supply electric energy, to generate an enable signal;
    means for producing a trigger signal in response to a predetermined number of said clock pulses of said clock pulse train occurring after said enable signal; and
    means for discharging electric energy stored in said means for storing to said ignition element in response to said trigger signal.

2. An electronic delay circuit for firing an ignition element as claimed in claim 1, wherein said means for over-exciting comprises means for driving said means for oscillating wit current from said means for storing after the electric energy is supplied, at least until said detecting means detects the elapsed time.

3. An electronic delay circuit for firing an ignition element as claimed in claim 1, wherein said trigger signal producing means comprises means for counting clock pulses of the clock pulse train, and the electronic delay circuit further includes means for maintaining a reset state of said means for counting and for releasing said reset state in response to the enable signal.

4. An electronic delay circuit for firing an ignition element as claimed in claim 3, wherein said means for maintaining the reset state comprises a time constant circuit and a comparator, said time constant circuit comprising a capacitor and a resistor, and said comparator comparing a voltage across said capacitor with a predetermined reference voltage.

5. An electronic delay circuit for firing an ignition element as claimed in claim 1, wherein said detecting means includes means for detecting an elapsed time equal to or less than 5 ms.

6. An electronic delay circuit for firing an ignition element as claimed in claim 1, further comprising discharging means, connected in parallel with said means for storing, for promoting discharge of said electric energy stored in said means for storing.

7. An electronic delay circuit for firing an ignition element as claimed in claim 3, further comprising discharging means, connected in parallel with said means for storing, for promoting discharge of said electric energy stored in said means for storing.

8. An electronic delay circuit for firing an ignition element as claimed in claim 2, wherein said trigger signal producing means comprises means for counting clock pulses of the clock pulse train, and the electronic delay circuit further includes means for maintaining a reset state of said means for counting and for releasing said reset state in response to the enable signal.

9. An electronic delay circuit for firing an ignition element as claimed in claim 3, wherein said means for counting is a preset counter whose initial value is set by cutting preset wire.

10. An electronic delay circuit for firing an ignition element as claimed in claim 2, wherein said means for driving comprises one or more clocked inverters connected in parallel with said means for oscillating.

11. An electronic delay circuit for firing an ignition element as claimed in claim 9, further comprising means for presetting the initial value of said preset counter, wherein said means for presetting comprises means for disconnecting said means for presetting from said means for storing after the preset of the initial value has been completed.

12. An electronic delay circuit for firing an ignition element as claimed in claim 10, further including means for rendering said clocked inverters sequentially inactive.

13. An electronic delay circuit for firing an ignition element as claimed in claim 8, wherein said means for osicllating, means for counting means for over-exciting and means for maintaining the reset state are integrated into one IC chip.

14. An electronic delay circuit for firing an ignition element as claimed in claim 1, wherein said means for oscillating, means for producing a trigger signal, and means for over-exciting are integrated into one IC chip.

15. An electronic delay circuit for firing an ignition element as claimed in claim 3, wherein said means for oscillating, means for counting, means for over-exciting and means for maintaining the reset state are integrated into one IC chip.

16. An electronic delay circuit for firing an ignition element as claimed in claim 8, wherein said means for counting includes a preset counter whose initial value is set by cutting preset wire.

17. An electronic delay circuit for firing an ignition element as claimed in claim 16, further comprising means for presetting the initial value of said preset counter, wherein said means for presetting comprises means for disconnecting said means for presetting from said means for storing after the preset of the initial value has been completed.

18. An electronic delay circuit for firing an ignition element as claimed in claim 8, wherein said means for maintaining the reset state comprises a time constant circuit and a comparator, said time constant circuit comprising a capacitor and a resistor, and said comparator comparing a voltage across said capacitor with a predetermined reference voltage.

19. An electronic delay circuit for firing an ignition element as claimed in claim 2, wherein said detecting means includes means for detecting an elapsed time equal to or less than 5 ms.

20. An electronic delay circuit for firing an ignition element as claimed in claim 2, further comprising discharging means, connected in parallel with said means for storing, for promoting discharge of said electric energy stores in said means for storing.

21. An electronic delay circuit for firing an ignition element comprising:
    means for storing electric energy supplied from an electric blasting machine;
    means for oscillating a clock pulse train by using the electric energy stored in said means for storing;
    means for over-exciting said means for oscillating;

means for counting clock pulses of said clock pulse train;

means for producing a trigger signal when said means for counting counts a predetermined number of said clock pluses of said clock pulses train;

means for discharging electric energy stored in said means for storing to said ignition element in response to said trigger signal; and means for maintaining a reset state of said means for counting for a second predetermined time period, equal to or less than 5 ms, after the electric energy is supplied, wherein said means for maintaining a reset state releases said reset state when said second predetermined time period is over so that said means for counting starts counting.

22. An electronic delay circuit for firing an ignition element comprising:

means for storing electric energy supplied from an electric blasting machine;

means for oscillating a clock pulse train by using the electric energy stored in said means for storing;

means for over-exciting said means for oscillating;

means for counting clock pulses of said clock pulse train, including a preset counter whose initial value is set by cutting preset wire;

means for producing a trigger signal when said means for counting counts a predetermined number of said clock pulses of said clock pulse train; and means for discharging electric energy stored in said means for storing to said ignition element in response to said trigger signal.

23. An electronic delay circuit for firing an ignition element as claimed in claim 22, further comprising means for presetting the initial value of said preset counter, wherein said means for presetting comprises means for disconnecting said means for presetting from said means for storing after the preset of the initial value has been completed.

24. A detonator comprising an electric delay circuit and a shell contained separately into a case, said shell containing a charge, said electric delay circuit comprising:

means for storing electric energy from an electric blasting machine;

means for oscillating a clock pulse train by using the electric energy stored in said means for storing;

means for detecting an elapsed time relative to a time when the electric blasting machine begins to supply electric energy, to generate an enable signal;

means for producing a trigger signal in response to a predetermined number of said clock pulse of said clock pulse train occurring after said enable signal;

means for discharging electric energy stored in said means for storing to said ignition element in response to said trigger signal; and means for over-exciting including means for driving said means for oscillating with current from said means for storing after the electric energy is supplied, at least until said detecting means detects the elapsed time.

25. A detonator as claimed in claim 24, wherein said trigger signal producing means comprises means for counting clock pulses of the clock pulse train, and the electronic delay circuit further includes means for maintaining a reset state of said means for counting and for releasing said reset state in response to the enable signal.

26. A detonator as claimed in claim 24, wherein said shell comprises an ignition resistor to which an output of said delay circuit is applied.

* * * * *

UNITED STATES PATENT AND TRADEMARK OFFICE
CERTIFICATE OF CORRECTION

PATENT NO. : 5,363,765  
DATED : November 15, 1994  
INVENTOR(S) : Kenichi AIKOU et al It is certified that error appears in the above-indentified patent and that said Letters Patent is hereby corrected as shown below:

Claim 2, Column 9, Line 30, change "wit" to --with--.

Claim 13, Column 10, Line 22, change "osicllating" to --oscillating--.

Claim 20, Column 10, Line 61, change "stores" to --stored--.

Claim 21, Column 11, Line 5, change "pluses" to --pulses--, and "pulses" to --pulse--

UNITED STATES PATENT AND TRADEMARK OFFICE
CERTIFICATE OF CORRECTION

PATENT NO. : 5,363,765

DATED : November 15, 1994

INVENTOR(S) : Kenichi AIKOU et al

It is certified that error appears in the above-indentified patent and that said Letters Patent is hereby corrected as shown below:

Claim 24, Column 12, Line 16, change "pulse" to --pulses--.

Signed and Sealed this

Fourth Day of July, 1995

BRUCE LEHMAN

*Attest:*

*Attesting Officer*     *Commissioner of Patents and Trademarks*